United States Patent
Black et al.

(10) Patent No.: US 9,000,656 B2
(45) Date of Patent: Apr. 7, 2015

(54) MICROELECTROMECHANICAL SYSTEM DEVICE INCLUDING A METAL PROOF MASS AND A PIEZOELECTRIC COMPONENT

(75) Inventors: Justin Phelps Black, San Jose, CA (US); Srinivasan Kodaganallur Ganapathi, San Jose, CA (US); Philip Jason Stephanou, San Jose, CA (US); Kurt Edward Peterson, San Jose, CA (US); Cenk Acar, Irvine, CA (US); Ravindra Vaman Shenoy, San Jose, CA (US); Nicholas Ian Buchan, San Jose, CA (US)

(73) Assignee: Qualcomm MEMS Technologies, Inc., San Diego, CA (US)

( * ) Notice: Subject to any disclaimer, the term of this patent is extended or adjusted under 35 U.S.C. 154(b) by 997 days.

(21) Appl. No.: 13/048,798

(22) Filed: Mar. 15, 2011

(65) Prior Publication Data

US 2012/0234093 A1    Sep. 20, 2012

(51) Int. Cl.
| | |
|---|---|
| *H01L 41/00* | (2013.01) |
| *H01L 41/113* | (2006.01) |
| *H01L 41/08* | (2006.01) |
| *G01C 19/5769* | (2012.01) |
| *B81B 3/00* | (2006.01) |

(52) U.S. Cl.
CPC ............ *H01L 41/1132* (2013.01); *H01L 41/08* (2013.01); *G01C 19/5769* (2013.01); *B81B 3/0078* (2013.01); *B81B 2201/0242* (2013.01)

(58) Field of Classification Search
CPC ............ B81B 3/0032; G01C 19/5621; G01C 19/5769; G01C 19/5755; H01L 41/1132

USPC ........ 73/504.08; 205/183; 310/363, 365, 366; 427/100
See application file for complete search history.

(56) References Cited

U.S. PATENT DOCUMENTS

| | | | |
|---|---|---|---|
| 5,744,947 A | * | 4/1998 | Jacobsen et al. .............. 324/106 |
| 5,905,044 A | | 5/1999 | Lee et al. |

(Continued)

FOREIGN PATENT DOCUMENTS

| | | |
|---|---|---|
| CN | 101536545 A | 9/2009 |
| EP | 0844461 | 5/1998 |

(Continued)

OTHER PUBLICATIONS

Li et al., "Study on structure optimization of a piezoelectric cantilever with a proof mass for vibration-powered energy harvesting system", Journal of Vacuum Science and Technology B vol. 27, Issue 3, 1288 (2009).

(Continued)

*Primary Examiner* — Laura Martin
*Assistant Examiner* — Samir M Shah
(74) *Attorney, Agent, or Firm* — Weaver Austin Villeneuve & Sampson

(57) ABSTRACT

This disclosure provides systems, apparatus, and devices and methods of fabrication for electromechanical devices. In one implementation, an apparatus includes a metal proof mass and a piezoelectric component as part of a MEMS device. Such apparatus can be particularly useful for MEMS gyroscope devices. For instance, the metal proof mass, which may have a density several times larger than that of silicon, is capable of reducing the quadrature and bias error in a MEMS gyroscope device, and capable of increasing the sensitivity of the MEMS gyroscope device.

13 Claims, 9 Drawing Sheets

(56) References Cited

U.S. PATENT DOCUMENTS

| | | | |
|---|---|---|---|
| 5,998,911 A * | 12/1999 | Kikuchi et al. | 310/367 |
| 6,407,484 B1 * | 6/2002 | Oliver et al. | 310/339 |
| 6,437,490 B1 * | 8/2002 | Yanagisawa et al. | 310/370 |
| 6,816,301 B1 | 11/2004 | Schiller | |
| 6,858,970 B2 * | 2/2005 | Malkin et al. | 310/322 |
| 7,183,699 B2 * | 2/2007 | Maruyama et al. | 310/365 |
| 7,224,105 B2 * | 5/2007 | Onishi et al. | 310/365 |
| 7,235,914 B2 * | 6/2007 | Richards et al. | 310/328 |
| 7,414,351 B2 | 8/2008 | Ulm et al. | |
| 2003/0227234 A1 * | 12/2003 | Namerikawa et al. | 310/358 |
| 2004/0020292 A1 | 2/2004 | Deng et al. | |
| 2004/0041498 A1 * | 3/2004 | Sakai | 310/339 |
| 2005/0052097 A1 * | 3/2005 | Tanaka et al. | 310/339 |
| 2005/0268444 A1 * | 12/2005 | Namerikawa et al. | 29/25.35 |
| 2006/0017353 A1 * | 1/2006 | Sakai | 310/339 |
| 2006/0186762 A1 * | 8/2006 | Sugiura et al. | 310/328 |
| 2006/0283245 A1 | 12/2006 | Konno et al. | |
| 2007/0084042 A1 | 4/2007 | Challoner et al. | |
| 2007/0114890 A1 * | 5/2007 | Churchill et al. | 310/339 |
| 2007/0125176 A1 * | 6/2007 | Liu | 73/649 |
| 2007/0188053 A1 * | 8/2007 | Stark | 310/339 |
| 2007/0284969 A1 * | 12/2007 | Xu | 310/339 |
| 2008/0074002 A1 * | 3/2008 | Priya et al. | 310/339 |
| 2008/0168840 A1 | 7/2008 | Seeley et al. | |
| 2009/0090200 A1 | 4/2009 | Mita et al. | |
| 2009/0244680 A1 | 10/2009 | Webster | |
| 2009/0260436 A1 * | 10/2009 | Tochi et al. | 73/504.12 |
| 2010/0072759 A1 * | 3/2010 | Andosca et al. | 290/1 R |
| 2011/0187237 A1 * | 8/2011 | Suenaga et al. | 310/363 |
| 2011/0265564 A1 | 11/2011 | Acar et al. | |
| 2011/0265565 A1 | 11/2011 | Acar et al. | |

FOREIGN PATENT DOCUMENTS

| | | | |
|---|---|---|---|
| JP | 62217115 | 9/1987 | |
| JP | H0791958 A | 4/1995 | |
| JP | H08114456 A | 5/1996 | |
| JP | H08278146 A | 10/1996 | |
| JP | 2003083751 A | 3/2003 | |
| JP | 2004289199 A | 10/2004 | |
| JP | 2006224219 A | 8/2006 | |
| JP | 2007000994 A | 1/2007 | |
| JP | 2007064752 A | 3/2007 | |
| JP | 2007110281 A | 4/2007 | |
| JP | 2009212620 A | 9/2009 | |
| JP | 2010014406 A | 1/2010 | |
| JP | 2011044558 A | 3/2011 | |
| WO | 2006126253 A1 | 11/2006 | |
| WO | WO2008116173 | 9/2008 | |
| WO | WO 2008116173 A1 * | 9/2008 | H01L 41/113 |

OTHER PUBLICATIONS

Alper et al., "Symmetrical and decoupled nickel microgyroscope on insulating substrate", Sensors and Actuators A, 115 (2004) pp. 336-350.

Alper et al., "A low-cost rate-grade nickel microgyroscope", Sensors and Actuators A, 132 (2006) pp. 171-181.

Shakoor et al., "Design Modeling and Simulation of Electrothermally Actuated Microgyroscope Fabricated using the MetalMUMPs", Therminic 2009, Oct. 7-9, 2009.

International Search Report and Written Opinion issued Aug. 3, 2012, from Application No. PCT/US2012/028624.

* cited by examiner

MICROELECTROMECHANICAL SYSTEM DEVICE INCLUDING A METAL PROOF MASS AND A PIEZOELECTRIC COMPONENT

TECHNICAL FIELD

This disclosure relates to electromechanical system devices and more particularly to microelectromechanical system devices that include a metal proof mass.

DESCRIPTION OF RELATED TECHNOLOGY

Electromechanical systems include devices having electrical and mechanical elements, actuators, transducers, sensors, optical components (e.g., mirrors), and electronics. Electromechanical systems can be manufactured at a variety of scales including, but not limited to, microscales and nanoscales. For example, microelectromechanical systems (MEMS) devices can include structures having sizes ranging from about a micron to hundreds of microns or more. Nanoelectromechanical systems (NEMS) devices can include structures having sizes smaller than a micron including, for example, sizes smaller than several hundred nanometers. Electromechanical elements may be created using deposition, etching, lithography, and/or other micromachining processes that etch away parts of substrates and/or deposited material layers, or that add layers to form electrical and electromechanical devices.

One type of electromechanical systems device is called an interferometric modulator (IMOD). As used herein, the term interferometric modulator or interferometric light modulator refers to a device that selectively absorbs and/or reflects light using the principles of optical interference. In some implementations, an interferometric modulator may include a pair of conductive plates, one or both of which may be transparent and/or reflective, wholly or in part, and capable of relative motion upon application of an appropriate electrical signal. In an implementation, one plate may include a stationary layer deposited on a substrate and the other plate may include a reflective membrane separated from the stationary layer by an air gap. The position of one plate in relation to another can change the optical interference of light incident on the interferometric modulator. Interferometric modulator devices have a wide range of applications, and are anticipated to be used in improving existing products and creating new products, especially those with display capabilities.

Some MEMS devices are configured to sense linear acceleration (e.g., an accelerometer) or rotational acceleration (e.g., a gyroscope). Such MEMS devices rely on the response of a proof mass that is part of the MEMS device to the linear or rotational acceleration. A proof mass that has a large mass will generally generate a larger response in the MEMS device than a proof mass with a small mass.

SUMMARY

The systems, methods, and devices of the disclosure each have several innovative aspects, no single one of which is solely responsible for the desirable attributes disclosed herein.

Implementations disclosed herein involve an apparatus with a metal layer representing a proof mass and a piezoelectric layer configured to respond to an electric field or to respond to a mechanical force. In some implementations, the apparatus is part of an electromechanical device. In some implementations, the apparatus is part of an electromechanical gyroscope device.

In one implementation, an apparatus includes a metal layer. A first dielectric layer is disposed on the metal layer. A first electrode layer is disposed on the first dielectric layer. A piezoelectric layer is disposed on the first electrode layer. The piezoelectric layer is configured to respond to an electric field or to respond to a mechanical force. A second electrode layer is disposed on the piezoelectric layer. The first electrode layer and the second electrode layer are configured to apply an electric field across the piezoelectric layer or to sense an electric field generated by the piezoelectric layer due to the mechanical force. A second dielectric layer is disposed on the second electrode layer.

In one implementation, an electromechanical gyroscope device includes a first apparatus configured as a drive component of the electromechanical gyroscope device. The first apparatus includes a metal layer. A first dielectric layer is disposed on the metal layer. A first electrode layer is disposed on the first dielectric layer. A piezoelectric layer is disposed on the first electrode layer. The piezoelectric layer is configured to respond to an electric field. A second electrode layer is disposed on the piezoelectric layer. The first electrode layer and the second electrode layer are configured to apply an electric field across the piezoelectric layer. A second dielectric layer is disposed on the second electrode layer.

In one implementation, an apparatus of an electromechanical device includes a metal layer. A first dielectric layer is disposed on the metal layer. A first electrode layer is disposed on the first dielectric layer. A first piezoelectric layer is disposed on the first electrode layer. The first piezoelectric layer is configured to respond to a mechanical force. A second electrode layer is disposed on the first piezoelectric layer. The first electrode layer and the second electrode layer are configured to sense a first electric field generated by the first piezoelectric layer in response to the mechanical force. A second piezoelectric layer is disposed on the second electrode layer. The second piezoelectric layer is configured to respond to the mechanical force. A third electrode layer is disposed on the second piezoelectric layer. The second electrode layer and the third electrode layer are configured to sense a second electric field generated by the second piezoelectric layer in response to the mechanical force. A differential signal is capable of being provided by the combination of the sensed first electric field and the sensed second electric field. A second dielectric layer is disposed on the third electrode layer.

In one implementation, a method includes forming a sacrificial layer on a substrate, forming a first dielectric layer on the sacrificial layer, forming a first electrode layer on the first dielectric layer, forming a piezoelectric layer on the first electrode layer, forming a second electrode layer on the piezoelectric layer, forming a second dielectric layer on the second electrode layer, and forming a metal layer on the second dielectric layer.

In one implementation, an apparatus includes an electromechanical system device. The electromechanical system device includes a first dielectric layer. A first electrode layer is disposed on the first dielectric layer. A piezoelectric layer is disposed on the first electrode layer. The piezoelectric layer is configured to respond to at least one of an electric field or a mechanical force. A second electrode layer is disposed on the piezoelectric layer. The first electrode layer and the second electrode layer are configured to apply an electric field across the piezoelectric layer or to sense an electric field generated by the piezoelectric layer due to the mechanical force. A second dielectric layer is disposed on the second electrode layer. A metal layer is disposed on the second dielectric layer.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale.

BRIEF DESCRIPTION OF THE DRAWINGS

The included drawings are for illustrative purposes and serve only to provide examples of possible structures and process steps for the disclosed processes, apparatus, and systems of electromechanical system devices that include mechanisms including a metal proof mass and a piezoelectric component.

Like reference numbers and designations in the various drawings indicate like elements.

DETAILED DESCRIPTION

Figure 1A:
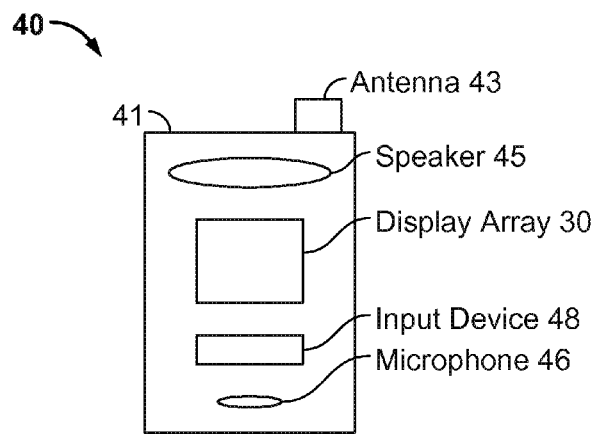
FIGS. 1A and 1B show examples of system block diagrams illustrating a display device that includes a MEMS device with a mechanism including a metal proof mass and a piezoelectric component.

The following detailed description is directed to certain implementations for the purposes of describing the innovative aspects. However, the teachings herein can be applied in a multitude of different ways. The described implementations may be implemented in any device that is configured to display an image, whether in motion (e.g., video) or stationary (e.g., still image), and whether textual, graphical or pictorial. More particularly, it is contemplated that the implementations may be implemented in or associated with a variety of electronic devices such as, but not limited to, mobile telephones, multimedia Internet enabled cellular telephones, mobile television receivers, wireless devices, smartphones, bluetooth devices, personal data assistants (PDAs), wireless electronic mail receivers, hand-held or portable computers, netbooks, notebooks, smartbooks, tablets, printers, copiers, scanners, facsimile devices, GPS receivers/navigators, cameras, MP3 players, camcorders, game consoles, wrist watches, clocks, calculators, television monitors, flat panel displays, electronic reading devices (e.g., e-readers), computer monitors, auto displays (e.g., odometer display, etc.), cockpit controls and/or displays, camera view displays (e.g., display of a rear view camera in a vehicle), electronic photographs, electronic billboards or signs, projectors, architectural structures, microwaves, refrigerators, stereo systems, cassette recorders or players, DVD players, CD players, VCRs, radios, portable memory chips, washers, dryers, washer/dryers, parking meters, packaging (e.g., MEMS and non-MEMS), aesthetic structures (e.g., display of images on a piece of jewelry) and a variety of electromechanical systems devices. The teachings herein also can be used in non-display applications such as, but not limited to, electronic switching devices, radio frequency filters, sensors, accelerometers, gyroscopes, motion-sensing devices, magnetometers, inertial components for consumer electronics, parts of consumer electronics products, varactors, liquid crystal devices, electrophoretic devices, drive schemes, manufacturing processes, electronic test equipment. Thus, the teachings are not intended to be limited to the implementations depicted solely in the Figures, but instead have wide applicability as will be readily apparent to one having ordinary skill in the art.

Disclosed are mechanisms of MEMS devices and methods of forming mechanisms for MEMS devices. In some implementations, layers of material making up a mechanism include a metal layer that serves as a proof mass and a piezoelectric layer. The piezoelectric layer can be sandwiched between two electrodes, and the electrodes can be insulated from layers other than the piezoelectric layer by dielectric layers. For example, some implementations include a metal layer, a first dielectric layer disposed on the metal layer, a first electrode layer disposed on the first dielectric layer, a piezoelectric layer disposed on the first electrode layer, a second electrode layer disposed on the piezoelectric layer, and a second dielectric layer is disposed on the second electrode layer. The piezoelectric layer may be configured to respond to an electric field or to respond to a mechanical force. The first electrode layer and the second electrode layer may be configured to apply an electric field across the piezoelectric layer or to sense an electric field generated by the piezoelectric layer due to the mechanical force. Such mechanisms can be used in electromechanical gyroscope and accelerometer devices, for example, as sense and/or drive components.

Particular implementations of the subject matter described in this disclosure can be implemented to realize one or more of the following potential advantages. Using a metal proof mass instead of, for example, a silicon proof mass can reduce errors and increase the sensitivity of some MEMS devices. Metals used for the proof mass can have a density several times that of silicon, resulting in a more massive proof mass. Such metal proof masses, as described herein, can generate a larger output and thus enhance the performance of MEMS devices, such as gyroscopes. A piezoelectric material serving as an actuator or drive component in a MEMS device uses a lower drive voltage compared to other materials/techniques and provides linear transduction. Piezoelectric materials also can exhibit a wide dynamic range of output signals in response to a mechanical force. As described herein, using piezoelectric materials as sensor or sense components in MEMS devices can result in an increased sensitivity, lower noise and lower cost MEMS device.

As noted above, one MEMS device that employs a proof mass is a gyroscope. One type of MEMS gyroscope is a vibrating structure gyroscope, also referred to as a Coriolis vibratory gyroscope. A vibrating structure gyroscope operates under the physical principle that a vibrating object (e.g., a proof mass) tends to keep vibrating in the same plane, even as the vibrating object's support structure is rotated. As the plane in which the proof mass is oscillating is rotated, this plane tends to remain fixed, resulting in out-of-plane motion of the proof mass relative to the support structure. This out-of-plane motion is due to the Coriolis term in the equation of motion (i.e., the Coriolis force). Angular rates of rotation are determined by measuring the magnitude of the out-of-plane motion of the proof mass with a transducer. The Coriolis force is proportional to the mass of the proof mass and to the amplitude and the frequency at which the proof mass is vibrating.

Figure 1B:
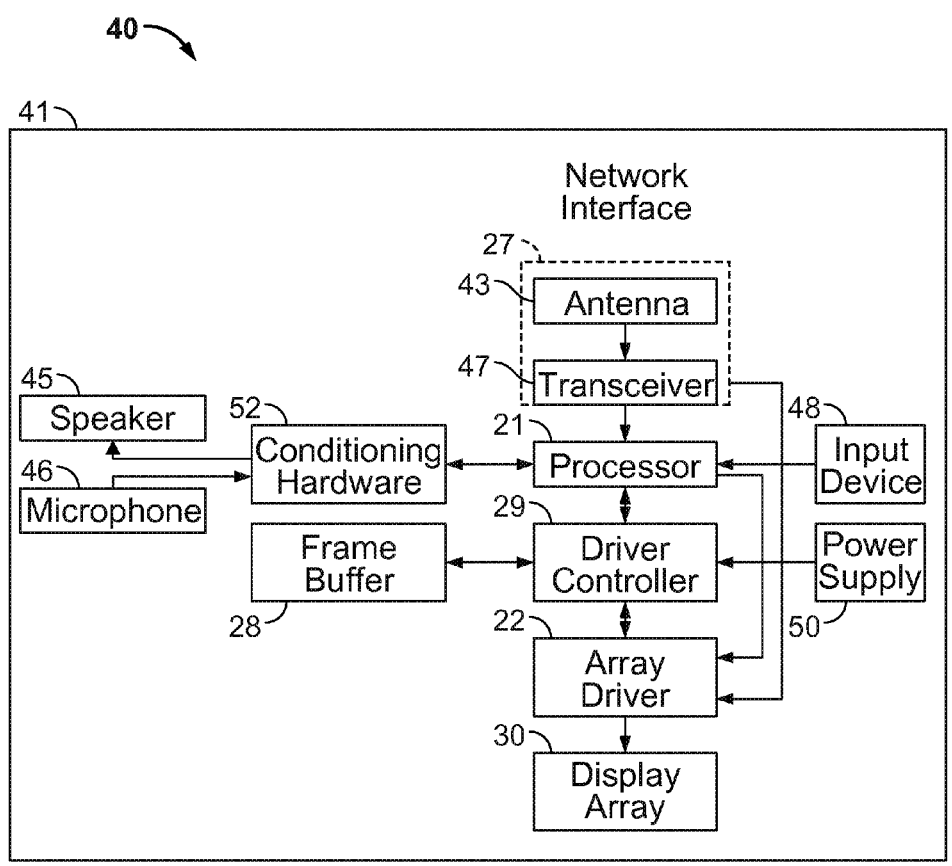

FIGS. 1A and 1B show examples of system block diagrams illustrating a display device that includes a MEMS device with a mechanism including a metal proof mass and a piezoelectric component. In some implementations, the MEMS device is a MEMS gyroscope device. However, the same components of the display device 40 or slight variations thereof are also illustrative of various types of display devices such as televisions, e-readers and portable media players.

The display device 40 includes a housing 41, a display 30, an antenna 43, a speaker 45, an input device 48, and a microphone 46. The housing 41 can be formed from any of a variety of manufacturing processes, including injection molding, and vacuum forming. In addition, the housing 41 may be made from any of a variety of materials, including, but not limited to: plastic, metal, glass, rubber, and ceramic, or a combination thereof. The housing 41 can include removable portions (not shown) that may be interchanged with other removable portions of different color, or containing different logos, pictures, or symbols.

The display 30 may be any of a variety of displays, including a bi-stable or analog display, as described herein. The display 30 also can be configured to include a flat-panel display, such as plasma, EL, OLED, STN LCD, or TFT LCD, or a non-flat-panel display, such as a CRT or other tube device. In addition, the display 30 can include an interferometric modulator display, as described herein.

The components of the display device 40 are schematically illustrated in FIG. 1B. The display device 40 includes a housing 41 and can include additional components at least partially enclosed therein. For example, the display device 40 includes a network interface 27 that includes an antenna 43 which is coupled to a transceiver 47. The transceiver 47 is connected to a processor 21, which is connected to conditioning hardware 52. The conditioning hardware 52 may be configured to condition a signal (e.g., filter a signal). The conditioning hardware 52 is connected to a speaker 45 and a microphone 46. The processor 21 is also connected to an input device 48 and a driver controller 29. The driver controller 29 is coupled to a frame buffer 28 and to an array driver 22, which in turn is coupled to a display array 30. A power supply 50 can provide power to all components as required by the particular display device 40 design.

The network interface 27 includes the antenna 43 and the transceiver 47 so that the display device 40 can communicate with one or more devices over a network. The network interface 27 also may have some processing capabilities to relieve, e.g., data processing requirements of the processor 21. The antenna 43 can transmit and receive signals. In some implementations, the antenna 43 transmits and receives RF signals according to the IEEE 16.11 standard, including IEEE 16.11 (a), (b), or (g), or the IEEE 802.11 standard, including IEEE 802.11a, b, g or n. In some other implementations, the antenna 43 transmits and receives RF signals according to the BLUETOOTH standard. In the case of a cellular telephone, the antenna 43 is designed to receive code division multiple access (CDMA), frequency division multiple access (FDMA), time division multiple access (TDMA), Global System for Mobile communications (GSM), GSM/General Packet Radio Service (GPRS), Enhanced Data GSM Environment (EDGE), Terrestrial Trunked Radio (TETRA), Wideband-CDMA (W-CDMA), Evolution Data Optimized (EV-DO), 1xEV-DO, EV-DO Rev A, EV-DO Rev B, High Speed Packet Access (HSPA), High Speed Downlink Packet Access (HSDPA), High Speed Uplink Packet Access (HSUPA), Evolved High Speed Packet Access (HSPA+), Long Term Evolution (LTE), AMPS, or other known signals that are used to communicate within a wireless network, such as a system utilizing 3G or 4G technology. The transceiver 47 can pre-process the signals received from the antenna 43 so that they may be received by and further manipulated by the processor 21. The transceiver 47 also can process signals received from the processor 21 so that they may be transmitted from the display device 40 via the antenna 43.

In some implementations, the transceiver 47 can be replaced by a receiver. In addition, the network interface 27 can be replaced by an image source, which can store or generate image data to be sent to the processor 21. The processor 21 can control the overall operation of the display device 40. The processor 21 receives data, such as compressed image data from the network interface 27 or an image source, and processes the data into raw image data or into a format that is readily processed into raw image data. The processor 21 can send the processed data to the driver controller 29 or to the frame buffer 28 for storage. Raw data typically refers to the information that identifies the image characteristics at each location within an image. For example, such image characteristics can include color, saturation, and gray-scale level.

The processor 21 can include a microcontroller, CPU, or logic unit to control operation of the display device 40. The conditioning hardware 52 may include amplifiers and filters for transmitting signals to the speaker 45, and for receiving signals from the microphone 46. The conditioning hardware 52 may be discrete components within the display device 40, or may be incorporated within the processor 21 or other components.

The driver controller 29 can take the raw image data generated by the processor 21 either directly from the processor 21 or from the frame buffer 28 and can re-format the raw image data appropriately for high speed transmission to the array driver 22. In some implementations, the driver controller 29 can re-format the raw image data into a data flow having a raster-like format, such that it has a time order suitable for scanning across the display array 30. Then the driver controller 29 sends the formatted information to the array driver 22. Although a driver controller 29, such as an LCD controller, is often associated with the system processor 21 as a stand-alone Integrated Circuit (IC), such controllers may be implemented in many ways. For example, controllers may be embedded in the processor 21 as hardware, embedded in the processor 21 as software, or fully integrated in hardware with the array driver 22.

The array driver 22 can receive the formatted information from the driver controller 29 and can re-format the video data into a parallel set of waveforms that are applied many times per second to the hundreds, and sometimes thousands (or more), of leads coming from the display's x-y matrix of pixels.

In some implementations, the driver controller 29, the array driver 22, and the display array 30 are appropriate for any of the types of displays described herein. For example, the driver controller 29 can be a conventional display controller or a bi-stable display controller (e.g., an IMOD controller). Additionally, the array driver 22 can be a conventional driver or a bi-stable display driver (e.g., an IMOD display driver).

Moreover, the display array 30 can be a conventional display array or a bi-stable display array (e.g., a display including an array of IMODs). In some implementations, the driver controller 29 can be integrated with the array driver 22. Such an implementation is common in highly integrated systems such as cellular phones, watches and other small-area displays.

In some implementations, the input device 48 can be configured to allow, e.g., a user to control the operation of the display device 40. The input device 48 can include a keypad, such as a QWERTY keyboard or a telephone keypad, a button, a switch, a rocker, a touch-sensitive screen, or a pressure- or heat-sensitive membrane. The microphone 46 can be configured as an input device for the display device 40. In some implementations, voice commands through the microphone 46 can be used for controlling operations of the display device 40.

The power supply 50 can include a variety of energy storage devices as are well known in the art. For example, the power supply 50 can be a rechargeable battery, such as a nickel-cadmium battery or a lithium-ion battery. The power supply 50 also can be a renewable energy source, a capacitor, or a solar cell, including a plastic solar cell or solar-cell paint. The power supply 50 also can be configured to receive power from a wall outlet.

In some implementations, control programmability resides in the driver controller 29 which can be located in several places in the electronic display system. In some other implementations, control programmability resides in the array driver 22. The above-described optimization may be implemented in any number of hardware and/or software components and in various configurations.

Figure 2A:
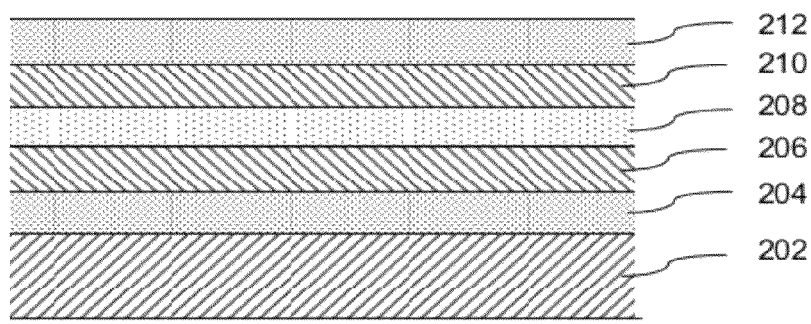
FIGS. 2A and 2B show examples of cross-sectional views of a mechanism of a MEMS device including a metal layer and a piezoelectric layer.
Figure 2B:
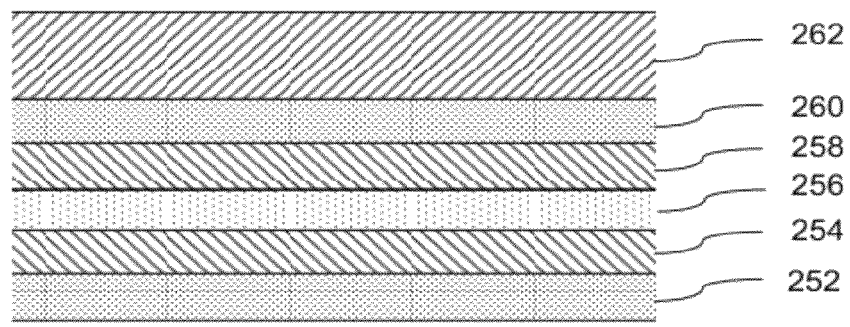

FIGS. 2A and 2B show examples of cross-sectional views of a mechanism of a MEMS device including a metal layer and a piezoelectric layer. The mechanism 201 includes a metal layer 202, a first dielectric layer 204, a first electrode layer 206, a piezoelectric layer 208, a second electrode layer 210, and a second dielectric layer 212 stacked in the sequence as illustrated in FIG. 2A. The first dielectric layer 204 is disposed on top of metal layer 202. The first electrode layer 206 is disposed on top of the first dielectric layer 204. The piezoelectric layer 208 is disposed on top of the first electrode layer 206. The second electrode layer 210 is disposed on top of the piezoelectric layer 208. The second dielectric layer 212 is disposed on top of the second electrode layer 210. In some implementations, the thickness of the metal layer 202 is greater than the combined thickness of the first dielectric layer 204, the first electrode layer 206, the piezoelectric layer 208, the second electrode layer 210, and the second dielectric layer 212. With the thickness of the metal layer 202 greater than the combined thickness of the other layers, the metal layer 202, which is denser than the other layers in some implementations, provides a proof mass with a relatively large mass. The thick metal layer 202 also forms part of a high quality factor (i.e., Q factor) resonator, in some implementations. High quality factor resonators oscillate with a smaller range of frequencies and are more stable than low quality factor resonators.

In some implementations, the metal layer covers an area of about 1.5 mm by 1.5 mm or smaller. The metal layer may be a square, rectangle, polygon or other shape. The areas of the metal layer that are part of the mechanism 201 of a MEMS device may be a portion of the entire area of the metal layer 202. The areas of the metal layer 202 that are part of the mechanism 201 are defined by the fabrication process, described below.

The metal layer 202 serves as a proof mass of a MEMS device such as an accelerometer or a gyroscope. The metal layer 202 may include one or more of a number of different metals, and combinations thereof. The metal layer 202, when part of a component in a MEMS device with the metal layer vibrating or otherwise in motion, includes a metal with appropriate mechanical properties (e.g., modulus, yield strength, fatigue resistance, mechanical viscosity, and creep resistance) such that it does not yield, fracture, or deform in a manner that would interfere with the operation of the MEMS device. For example, in various implementations, the metal of the metal layer is nickel, an alloy of nickel and manganese, or an alloy of nickel and cobalt. In some implementations a nickel alloy is used instead of nickel due to the better mechanical properties of the nickel alloy. Nickel and nickel-based alloys have a density that is several times the density of silicon; a metal proof mass of these alloys provides a large mass in a smaller volume than would be occupied by a proof mass of silicon of the same mass. In some implementations, the metal layer includes aluminum or copper. Other metals also may be used for the metal layer. Higher density metals provide a more massive proof mass with less metal. In some implementations, the metal layer has a thickness in the range of about 5 to 25 micrometers. In some other implementations, the metal layer has a thickness of greater than about 5 micrometers.

The first dielectric layer 204 on top of metal layer 202 serves as an insulator. The second dielectric layer 212 on top of second electrode layer 210 also serves as an insulator. The dielectric layers may include a number of different materials, and combinations thereof. For example, in various implementations, the dielectric layers are an oxide, including silicon oxide, low stress nitride, or any other appropriate material. In some implementations, the first dielectric layer and the second dielectric layer are each in the range of about 100 to 300 nanometers thick.

The first electrode layer 206 and the second electrode layer 210 serve either to apply an electric field across the piezoelectric layer 208 or to sense an electric field generated by the piezoelectric layer 208, as described below with respect to FIG. 3. When the mechanism 201 is part of a piezoelectric drive component of a MEMS gyroscope device, the first and second electrode layers 206 and 210 serve to apply an electric field across the piezoelectric layer 208. The drive component is the component that causes the proof mass to vibrate. When the mechanism 201 is part of a piezoelectric sense component of a MEMS gyroscope device, the first and second electrode layers 206 and 210 serve to measure an electric field generated by the piezoelectric layer 208. The sense component is the component that measures the out-of-plane motion of the proof mass in the MEMS device. The configuration of the first electrode layer 206 and the second electrode layer 210 for both the application of an electric field and the sensing of an electric field are similar in some implementations.

In some implementations of the mechanism 201 in a MEMS device, a single metal layer has two associated electrode layers and a piezoelectric layer that act as a drive component, and two additional associated electrode layers, and an additional piezoelectric layer that act as a sense component. For example, some implementations may include a metal layer 202 having a large surface area. On certain regions of the metal layer 202, there may be mechanisms including layers 204-212 as shown in FIG. 2A that act as drive components. On other regions of the metal layer, there may be further mechanisms including layers 204-212 as shown in FIG. 2A that act as sense components. For example, a metal layer may include multiple mechanisms acting as drive components and multiple mechanisms acting as sense components disposed on the same side of the metal layer. As another example, a metal layer may include multiple mechanisms acting as drive components disposed on one side of the metal layer and multiple mechanisms acting as sense components disposed on the other side of the metal layer.

In some other implementations of the mechanism 201 in a MEMS device, a first metal layer has two associated electrode layers 206 and 210 and a piezoelectric layer 208 as shown in FIG. 2A that act as a drive component. The MEMS device also includes a second metal layer having two associated electrode layers 206 and 210 and a piezoelectric layer 208 as shown in FIG. 2A that act as a sense component. The first and second metal layers may be positioned side-by-side, in the same plane, in the MEMS device. In this implementation, with the first and the second metal layers positioned side-by-side, in the same plane, the first and the second metal layers may be coupled together with mechanical flexures. For example, a mechanical flexure may connect an edge of the first metal layer to an edge of the second metal layer. In some implementations, the mechanical flexure is a beam of material that may elastically deform such that the two metal layers in a MEMS device are able to move, both in the plane of the first and second metal layers and out of the plane of the first and second metal layers, with respect to one another. The mechanical flexure may be the same thickness as the first metal layer or the second metal layer, and may be the same metal as the first metal layer or the second metal layer.

In some implementations of a mechanism that is part of a sense component, the electrodes 206 and 210 and the piezoelectric layer 208 can be situated in a region of a MEMS device in which a large strain is expected to be generated in the piezoelectric layer. Such a region may be a beam, for example. A large strain in the piezoelectric layer would produce a large electric field that would be measured by the electrodes. In some implementations, the piezoelectric layer has tapered dimensions in order to provide uniform stress distributions in the piezoelectric layer.

In some implementations of a mechanism that is part of a drive component, the electrodes 206 and 210 and the piezoelectric layer 208 can be situated on beams within a mechanical suspension in a MEMS device. The electrodes and the piezoelectric layer can be situated such that the piezoelectric layer may produce a large moment arm that causes the proof mass to vibrate.

In some implementations, the thickness of the proof mass or masses in a MEMS device may be varied in order increase the amplitude of the output signal. For example, a mechanism that is part of a drive component in a MEMS device may have a thicker metal layer than a mechanism that is part of a sense component in order to increase the response of the MEMS device to liner acceleration or angular rotation.

The first electrode layer 206 and the second electrode layer 210 may include one or more of a number of different metals, and combinations thereof. For example, in various implementations, the electrode layers are ruthenium, tungsten, platinum, molybdenum, aluminum, titanium, and/or gold. In some implementations, the first electrode layer 206 and the second electrode layer 210 are each in the range of about 100 to 300 nanometers thick.

The piezoelectric layer 208 may include a number of different piezoelectric materials. For example, in various implementations, the piezoelectric layer 208 is aluminum nitride, lead zirconate titanate, gallium arsenide, and/or zinc oxide. Single crystal materials, including quartz, lithium niobate, and/or lithium tantalate, are used for the piezoelectric layer 208 in some other implementations. In implementations in which the piezoelectric layer 208 is aluminum nitride, the electrode layers can be platinum, molybdenum, tungsten, or aluminum. The piezoelectric layer generates an electric field in response to an applied mechanical force that produces a strain in the piezoelectric layer. Conversely, the piezoelectric layer generates a mechanical force in response to an applied electric field; i.e., the piezoelectric layer expands and contracts in response to an applied voltage.

In some implementations, the piezoelectric layer is in the range of about 0.5 to 3 micrometers thick. Also, in some implementations, a piezoelectric seed layer is crystallographically oriented, and its root mean square roughness is less than about 1 nanometer. A low surface roughness of the piezoelectric seed layer yields a high degree of crystallinity in the aluminum nitride layer, which corresponds to good piezoelectric characteristics of the aluminum nitride. In some implementations, the aluminum nitride crystals have their crystallographic c-axes perpendicular to the electrode layers. In some other implementations, the aluminum nitride crystals have their crystallographic c-axes parallel to the electrode layers. When the mechanism is part of a gyroscope or accelerometer MEMS device, the piezoelectric coefficient and loss tangent of the piezoelectric layer are properties to be considered.

The mechanisms disclosed herein may be fabricated by forming and/or depositing the layers using different techniques, as described below. For example, in some implementations, fabricating the mechanism 201 includes forming the metal layer 202, forming the first dielectric layer 204 on the metal layer 202, forming the first electrode layer 206 on the first dielectric layer 204, forming the piezoelectric layer 208 on the first electrode layer 206, forming the second electrode layer 210 on the piezoelectric layer 208, and forming the second dielectric layer 212 on the second electrode layer 210.

FIG. 2B shows an example of a cross-sectional view of a mechanism of a MEMS device including a metal layer and a piezoelectric layer. The mechanism 251 includes a first dielectric layer 252, a first electrode layer 254, a piezoelectric layer 256, a second electrode layer 258, a second dielectric layer 260, and a metal layer 262. FIG. 2B is similar to FIG. 2A, except that the order of the layers in the mechanism 251 of FIG. 2B is reversed compared to the mechanism 201 of FIG. 2A, i.e., as shown in FIG. 2B, the dielectric layer 252 is on the bottom instead of the metal layer 202. The dielectric layers, electrode layers, piezoelectric layer, and metal layer in the mechanism 251 can be similar to or the same as the dielectric layers, electrode layers, piezoelectric layer, and metal layer in the mechanism 201. The mechanisms disclosed herein may be fabricated by forming and/or depositing the layers using different techniques; different techniques for forming and/or depositing layers are described further below. For example, in some implementations, fabricating the mechanism 251 includes forming the first dielectric layer 252, forming the first electrode layer 254 on the first dielectric layer 252, forming the piezoelectric layer 256 on the first electrode layer 254, forming the second electrode layer 258 on the piezoelectric layer 256, forming the second dielectric layer 260 on the second electrode layer 258, and forming the metal layer 262 on the second dielectric layer 260.

Figure 2C:
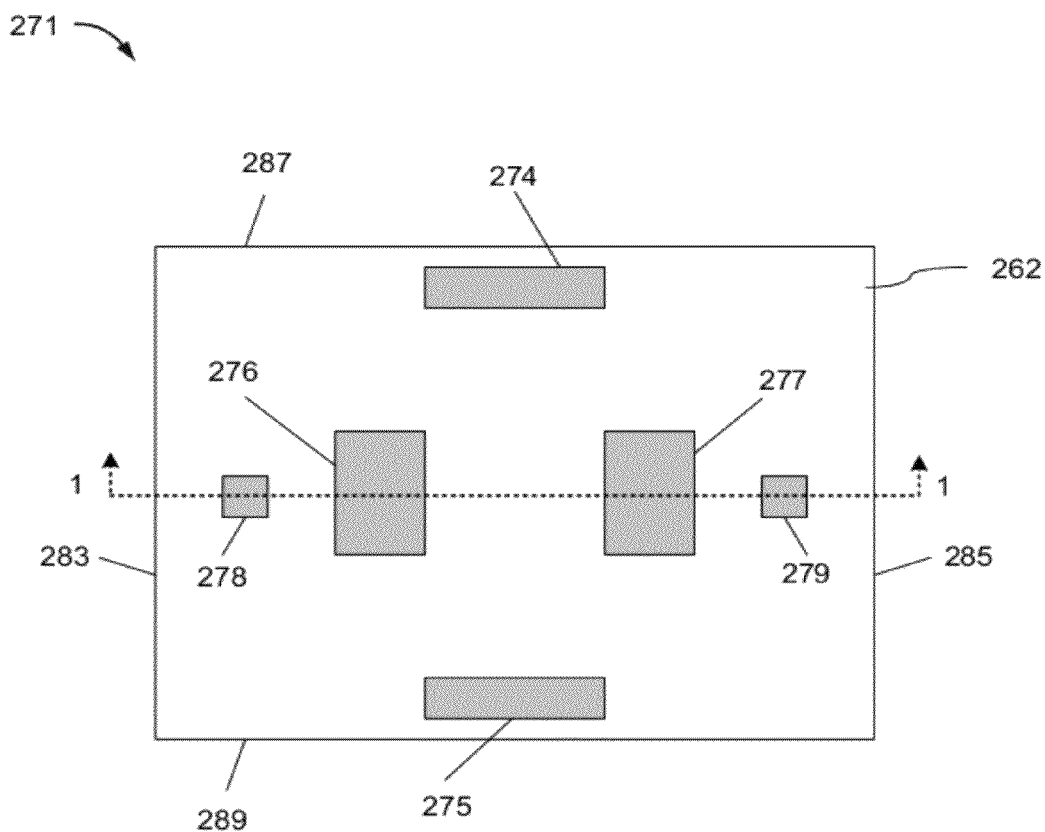
FIG. 2C shows an example of a schematic diagram of a top down view of a MEMS device incorporating mechanisms shown in FIG. 2B.

FIG. 2C shows an example of a schematic diagram of a top-down view of a MEMS device incorporating mechanisms shown in FIG. 2B. In FIG. 2C, the MEMS device is a MEMS gyroscope device 271. The MEMS gyroscope device 271 includes a metal layer 262, two underlying drive mechanisms 276 and 277, two underlying sense mechanisms 274 and 275, and two underlying anchor mechanisms 278 and 279. The metal layer 262 has sidewalls 283, 285, 287 and 289, described further below. The drive mechanisms 276 and 277 and the sense mechanisms 274 and 275 all include the mechanism 251. The portions of the metal layer 262 that are not attached to an underlying substrate (shown in FIG. 2D) by anchor mechanisms 278 and 279 are configured to vibrate in the plane of the page of FIG. 2C due to mechanical forces generated by the piezoelectric layers of the two drive mechanisms 276 and 277. For example, the portions of the metal layer 262 that are not attached to an underlying substrate may vibrate left and right in the plane of the page, up and down in the plane of the page, or about an axis perpendicular to the plane of the page. The portions of metal layer 262 that are not attached to the underlying substrate by the anchor mechanisms 278 and 279 also can be configured to move out of the plane of the page of FIG. 2C; the piezoelectric layers of the two sense mechanisms 274 and 275 can generate a voltage due to strain induced in the piezoelectric material due to this out-of-plane motion. In some implementations, metal layer 262 is coupled to the anchor mechanisms 278 and 279 with a mechanical flexure. In some implementations, the mechanical flexures are beams of material that may elastically deform such that the metal layer 262 is able to move or vibrate. The mechanical flexure may include a metal layer or layers. In some implementations, electrical signals from a sense component or to a drive component may be communicated through the anchor. In some other implementations, electrical signals are communicated through a wirebond or through other means of routing.

In some implementations, a drive or sense mechanism is about a few hundred micrometers on a side or larger. A drive or sense mechanism may be a number of different shapes, including a rectangle, a polygon, or a conic section, for example. In some implementations, a drive or sense mechanism may conform to the dimensions of and be situated on a beam of a mechanical suspension in a MEMS device.

Figure 2D:
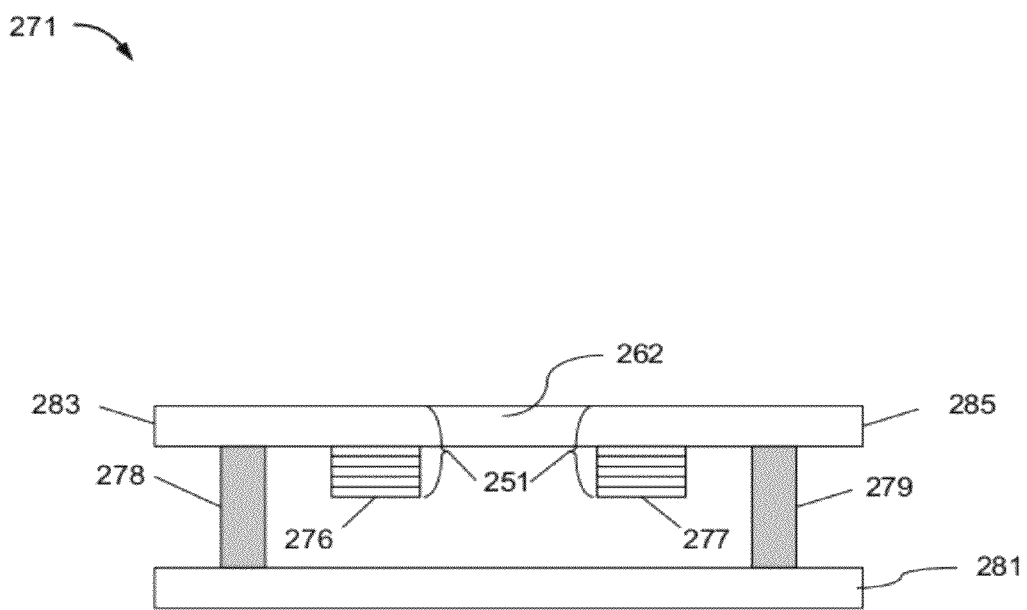
FIG. 2D shows an example of a cross-sectional view of the MEMS device of FIG. 2C.

FIG. 2D shows an example of a cross-sectional view of the MEMS device of FIG. 2C. That is, FIG. 2D is a side view of a MEMS gyroscope device 271 through line 1-1 of FIG. 2C. In this view of MEMS gyroscope device 271, metal layer 262, anchor mechanisms 278 and 279, drive mechanisms 276 and 277, and substrate 281 are shown. Each of drive mechanisms 276 and 277 includes a mechanism 251. For a further discussion of MEMS gyroscope devices, see "MEMS Vibratory Gyroscopes: Structural Approaches to Improve Robustness," by Cenk Acar and Andrei Shkel (Springer, 2nd edition, Oct. 23, 2008), which is hereby incorporated by reference in its entirety.

The piezoelectric drive mechanisms 276 and 277 can be designed to excite in-plane motion of the metal layer 262, e.g., in and out of the plane of the page of FIG. 2D, or left to right in FIG. 2D. The piezoelectric drive mechanism also can be designed to excite out-of-plane motion of the metal layer 262, e.g., up and down in FIG. 2D. With piezoelectric drive mechanisms able to excite in and out-of-plane motion of a metal layer, both y-axis and z-axis MEMS gyroscope devices may be constructed.

In some implementations, the sidewalls 283 and 285 of the metal layer 262 have a set geometry. For example, the sidewalls 283 and 285 may be perpendicular to the substrate 281. In some implementations, the sidewalls 283 and 285 are symmetrical. That is, the orientations of the sidewalls 283 and 285 may be mirror images of each other; for example, when the sidewall 283 is perpendicular to the substrate 281, the sidewall 285 also may be perpendicular to the substrate 281. As another example, when the sidewall 283 has a curved surface, the sidewall 285 may have the same contour and be a mirror image of the sidewall 283. The sidewalls 287 and 289 of the metal layer 262 may have similar relative orientations as the sidewalls 283 and 285; i.e., the sidewalls 287 and 289 may be perpendicular to the substrate 281 or the sidewalls 287 and 289 may be symmetrical (i.e., the orientations of the sidewalls 287 and 289 may be mirror images of each other), in some implementations. In some implementations, the geometries of the sidewalls 283, 285, 287 and 289 of the metal layer 262 are specified to reduce quadrature error when the MEMS device is in operation. The geometries of the sidewalls 283, 285, 287 and 289 of the metal layer 262 may be controlled in the fabrication process, as described with respect to FIG. 6.

Figure 3:
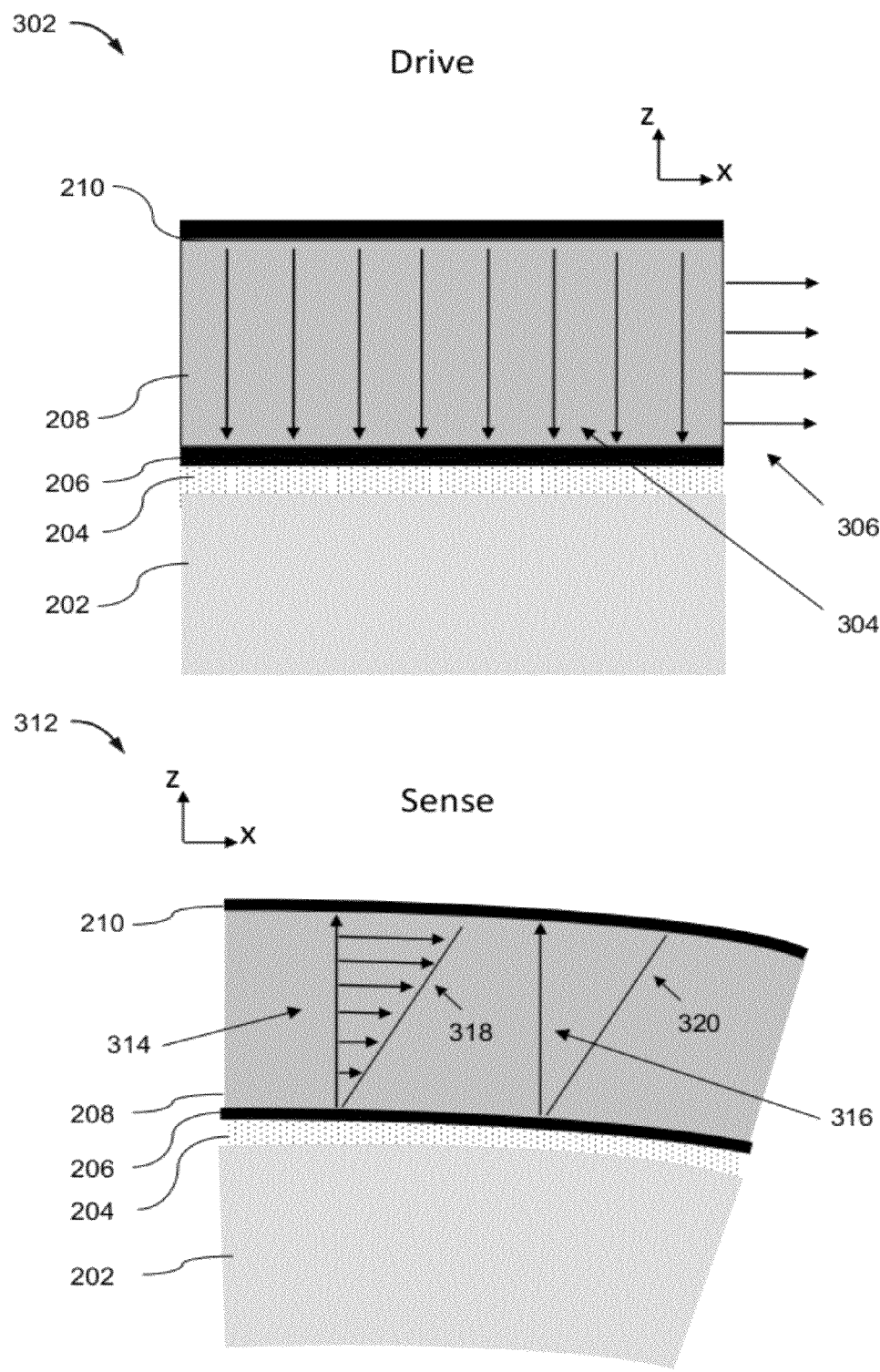
FIG. 3 shows examples of cross-sectional views of a piezoelectric layer functioning as a drive mechanism and a piezoelectric layer functioning as a sense mechanism.

FIG. 3 shows examples of cross-sectional views of a piezoelectric layer functioning as a drive mechanism and a piezoelectric layer functioning as a sense mechanism. In 302, when an electric field 304 is applied in the z-direction between the electrodes 206 and 210, a strain 306 is produced in the x-direction in the piezoelectric layer 208. In 312, when a strain 314 is induced in the piezoelectric layer 208 due to bending, an electric field 316 is produced between the electrodes 206 and 210. The strain 314 represents a component of the strain in the x-direction. The electric field 316 represents the vertical component of the electric field. 318 indicates the magnitude of the strain 314 as a function of position across the thickness of the piezoelectric layer 208; the strain near electrode 206 is smaller than the strain near electrode 210. Electric field component 320 indicates the amplitude of the vertical component of the electric field across the thickness of the piezoelectric layer 208; the electric field near electrode 206 is smaller than the electric field near electrode 210.

Figure 4:
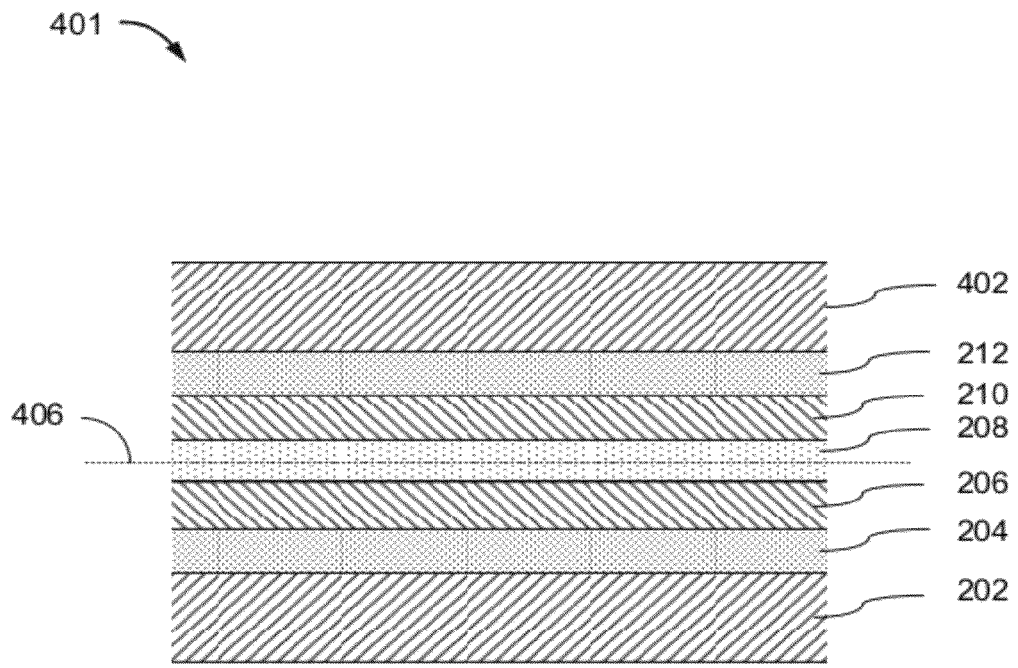
FIG. 4 shows an example of a cross-sectional view of a mechanism of a MEMS device including a metal layer and a piezoelectric layer.

FIG. 4 shows an example of a cross-sectional view of a mechanism of a MEMS device including a metal layer and a piezoelectric layer. The mechanism in FIG. 4 is symmetrical through the thicknesses (i.e., horizontally) of the layers. The mechanism 401 is similar to the mechanism 201, with the addition of the second metal layer 402, which serves as a second proof mass, disposed on the second electrode layer 212. The second metal layer 402 may include the same metals and be geometrically configured in a similar manner as metal layer 202.

In some implementations, the second metal layer 402 is geometrically configured in a different manner compared to the metal layer 202 to: suppress parasitic modes of vibration; provide more compliance in beams of a mechanical flexure by thickening the proof mass or masses to increase the signal generated by the piezoelectric layer; or increase the momentum transfer to the proof mass by thickening the proof mass or masses.

In implementations where the second metal layer 402 has the same mass and mass distribution as the metal layer 202, the mechanism 401 is substantially symmetrical with a neutral axis along the cross-section of the mechanism indicated by dashed line 406. When such a mechanism of a MEMS gyroscope device is driven to vibrate, due to the symmetry of the layers, the resulting vibratory motion does not contribute to out-of-plane motion that would be sensed as angular rotation in a MEMS gyroscope device.

Figure 5:
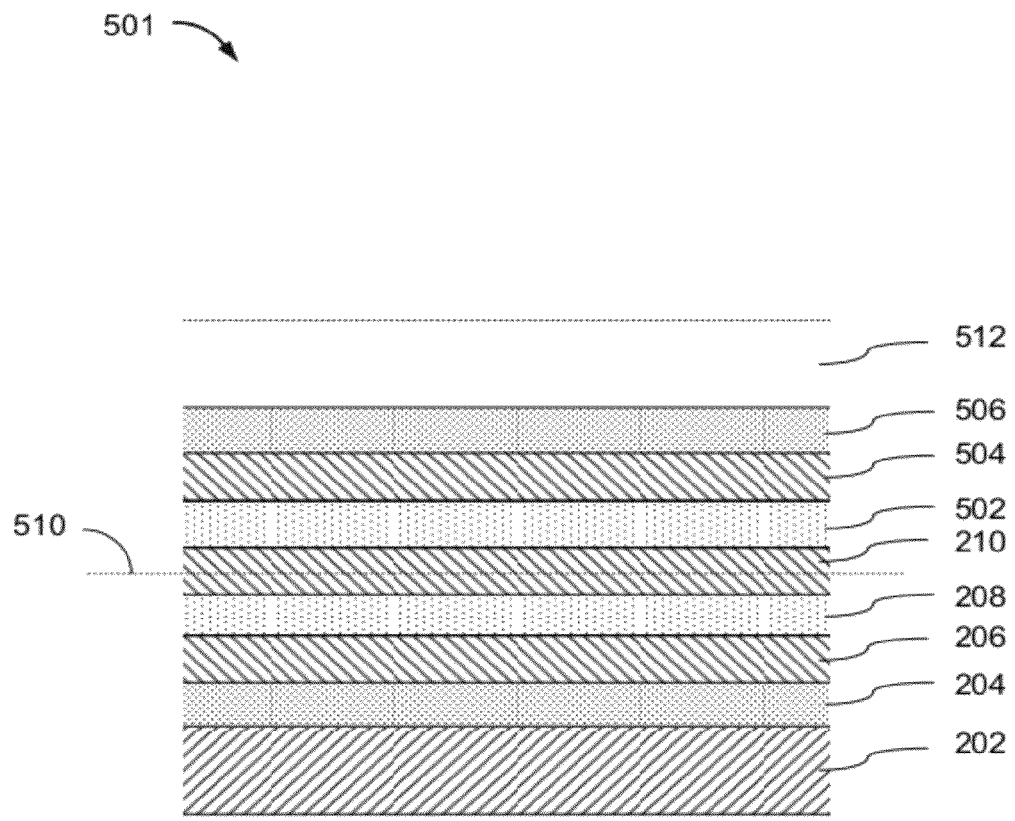
FIG. 5 shows an example of a cross-sectional view of a mechanism of a MEMS device including a metal layer and a piezoelectric layer.

FIG. 5 shows an example of a cross-sectional view of a mechanism of a MEMS device including a metal layer and a piezoelectric layer. The mechanism 501 includes a metal layer 202 serving as a proof mass, a first dielectric layer 204, a first electrode layer 206, a first piezoelectric layer 208, a second electrode layer 210, a second piezoelectric layer 502, a third electrode layer 504, and a second dielectric layer 506. The first dielectric layer 204 is disposed on the metal layer 202. The first electrode layer 206 is disposed on the first dielectric layer 204. The first piezoelectric layer 208 is disposed on the first electrode layer 206. The second electrode layer 210 is disposed on the piezoelectric layer 208. The second piezoelectric layer 502 is disposed on the second electrode layer 210. The third electrode layer 504 is disposed on the second piezoelectric layer 502. The second dielectric layer 506 is disposed on the third electrode layer 504. The additional layers in the mechanism 501, i.e., the second piezoelectric layer 502, the third electrode layer 504, and the second dielectric layer 506, may be similar to or the same as the other piezoelectric layer, electrode layers, and dielectric layers in the mechanism.

A piezoelectric material generates an electric field of one polarity when in tension, and generates an electric field of the opposite polarity when in compression. Thus, when the mechanism 501 is part of a piezoelectric sense component of a MEMS gyroscope device, the two piezoelectric layers can be configured to generate a differential signal, resulting in more accurate sensing of the out-of-plane motion of the proof mass. For example, during operation of a MEMS gyroscope device including the mechanism 501, when the first piezoelectric layer 208 is in tension, the second piezoelectric layer 502 can be in compression, generating a differential signal.

In some implementations, the mechanism 501 includes a second metal layer 512 to serve as a second proof mass. The second metal layer 512 is disposed on the second dielectric layer 506. With the addition of the second metal layer 512, the mechanism 501 may be symmetrical through the layer thicknesses with a neutral axis indicated by dashed line 510, similar to the mechanism 401, in some implementations.

Further implementations of mechanisms are also possible. For example, a mechanism may include a metal layer with dielectric layers, electrode layers, and a piezoelectric layer on the top and the bottom of the metal layer. Such a mechanism may be used as a sense component or a drive component of a device, such as a MEMS device. In some implementations, such a mechanism can be symmetrical, and the mechanism can increase the force generated when configured as a drive component, resulting in a larger amplitude in the vibration of the metal layer. When configured as a sense component, such a mechanism may generate a larger electric signal.

MEMS devices may incorporate any mechanism disclosed herein. In some implementations, the mechanism can serve as either a sense component or a drive component of the device. In some implementations in which one or more mechanisms serve as drive components, one of more mechanisms also can serve as sense components. For some MEMS gyroscope devices, the drive components serve to drive the proof mass such that it vibrates. For some MEMS gyroscope devices, the sense components serve to sense the in-plane or out-of-plane motion of the vibrating proof mass. For example, a y-axis MEMS gyroscope device may have drive components that drive the proof mass in-plane, and sense components that sense out-of-plane motion of the vibrating proof mass. Alternatively, a y-axis MEMS gyroscope device may have drive components that drive the proof mass out-of-plane and sense components that sense in-plane motion of the vibrating proof mass. A z-axis MEMS gyroscope device may have drive components that drive the proof mass in-plane and sense components that sense in-plane motion of the vibrating proof mass.

In some implementations, MEMS gyroscope device drive and sense frequencies can be offset a few hundred Hertz. In some implementations of MEMS gyroscope devices, one or more mechanisms serve as drive components and electrostatic capacitor terminals serve as sense components. For example, in one implementation of a y-axis MEMS gyroscope device, an electrostatic capacitor terminal is formed by the metal layer serving as a proof mass and a flat metal electrode on the substrate underneath the metal layer. In another example, in a z-axis MEMS gyroscope device, an electrostatic capacitor terminal is formed by lateral interdigitated or closing-gap capacitors around the perimeter of the MEMS gyroscope device. Persons having ordinary skill in the art will readily recognize such lateral interdigitated or closing-gap capacitors. In implementations using electrostatic capacitor terminals as sense components, angular rotation can be detected in the MEMS gyroscope device by measuring the change in electrode capacitance with a carrier signal at a frequency far removed from the drive frequency, simplifying the control circuitry. For example, the change in electrode capacitance can be measured with a carrier signal at a frequency on the order of megahertz. Such electrostatic transducers also may be used for active quadrature correction, in which a feedback loop reduces the amount of quadrature signal coupling to the sense frame.

The metal proof mass may reduce both quadrature and bias error in the MEMS gyroscope devices disclosed herein. The metal proof mass also may increase the sensitivity of a MEMS gyroscope device; in some implementations, the metals and metal alloys of the proof mass have a density several times that of silicon, increasing the out-of-plane motion of the proof mass for a given angular rotation rate.

Figure 6:
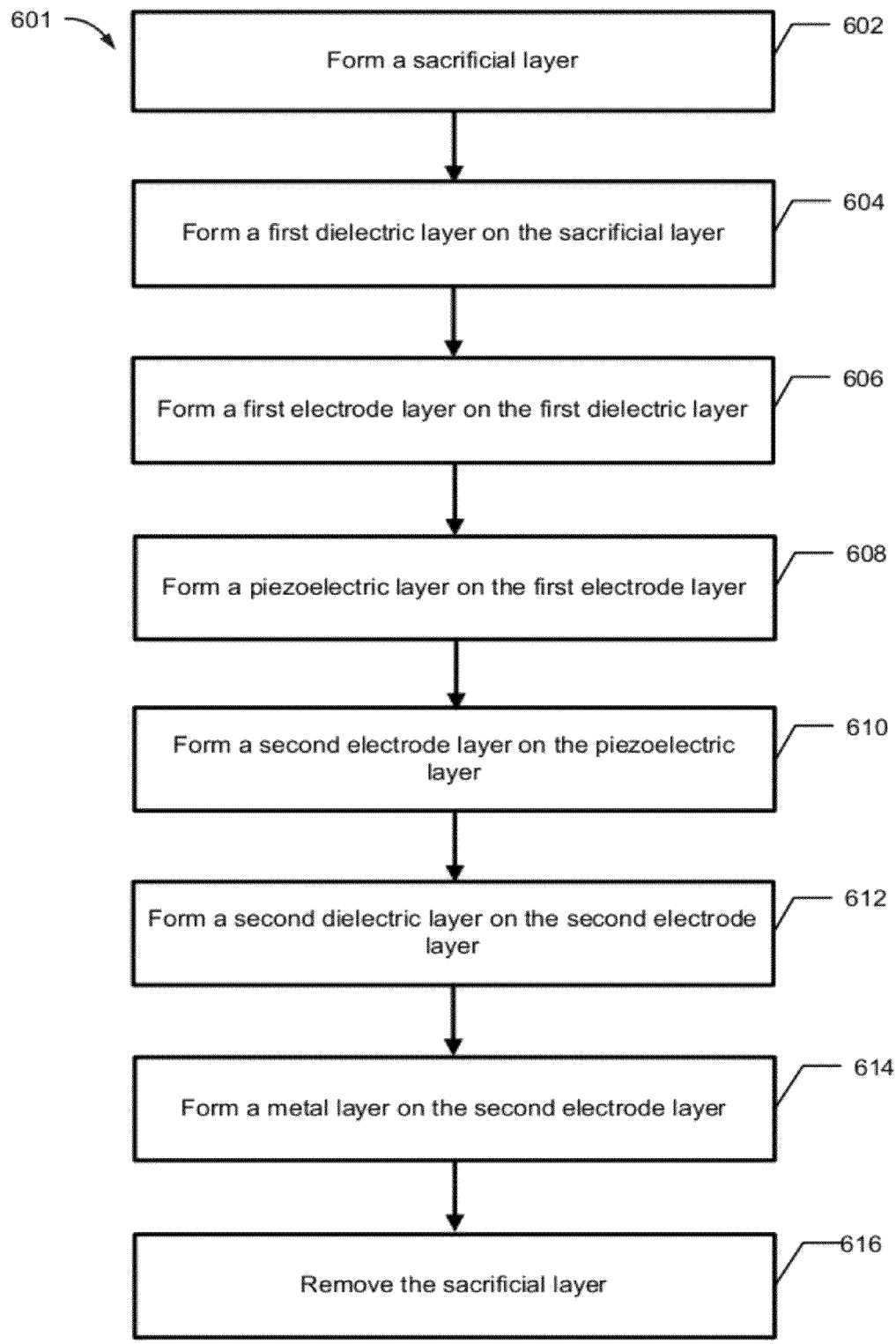
FIG. 6 shows an example of a flow diagram depicting a method of forming a mechanism of a MEMS device including a metal layer and a piezoelectric layer.

FIG. 6 shows an example of a flow diagram depicting a method of forming a mechanism of a MEMS device including a metal layer and a piezoelectric layer. The method 601, as set forth below, includes operations for forming the mechanism 251 of FIG. 2B. Note that the operations of the method 601 may be combined and/or rearranged to form any of the mechanisms disclosed herein. Note also that the patterning and etching of the different layers, as described below, may be performed to achieve different patterns of the layers in different regions of a MEMS device. As noted above, the areas of the metal layer that are part of the mechanism of a MEMS device may be a portion of the entire area covered by the metal layer in some implementations of a MEMS device. The dielectric layers serve in part to insulate the electrode layers, and the electrode layers serve in part to apply a voltage to, or to sense a voltage from, the piezoelectric layer. In the portions of the metal layer not including the piezoelectric layer, the other layers (i.e., the dielectric layers and the electrode layers) may not be associated with these portions the metal layer; the portions of the metal layer that are part of a mechanism of a MEMS device are defined with the patterning and etching operations.

In some implementations, the mechanism is formed on or associated with a substrate. In some implementations, the substrate is a silicon wafer. In further implementations, the substrate is a flat-panel glass substrate. Because operations of the method 601 can be performed in the range of about room temperature to 400° C. (e.g., the processes of the method are performed at 400° C. or lower), the method 601 is compatible with flat-panel display glass technologies.

In block 602, a sacrificial layer is formed on the substrate. Prior to forming the sacrificial layer on the substrate, chromium or gold metallization can be deposited onto the substrate. When chromium or gold metallization is deposited onto the substrate, an oxide may be deposited onto the chromium or gold metallization to cover the chromium or gold metallization. In some implementations, the chromium or gold metallization serves as electric contact points for the first and the second electrodes in some MEMS devices.

In some implementations, a copper layer is used as the sacrificial layer. The copper layer may be sputtered, evaporated, or electroplated onto the substrate. The copper layer is in the range of about 0.1 to 20 micrometers thick in various implementations. In some implementations, an aluminum layer is used as the sacrificial layer. The aluminum layer may be sputtered or evaporated onto the substrate. The aluminum layer is in the range of about 0.1 to 10 micrometers thick in various implementations. In further implementations, a molybdenum layer or an amorphous silicon layer is used as the sacrificial layer. The molybdenum layer or amorphous silicon layer may be sputtered or evaporated onto the substrate. The molybdenum layer or amorphous silicon layer is in the range of about 0.1 to 10 micrometers thick in various implementations.

In some implementations, the sacrificial layer is then patterned and etched. The sacrificial layer may be patterned with photoresists used in integrated circuit manufacturing as known by a person having ordinary skill in the art and then etched. Copper may be etched with a wet etching process using a hydrogen peroxide and acetic acid based etchant or using an ammonical sodium persulfate solution. Aluminum may be etched with a wet etching process using an alkaline based etchant. Alkaline based etchants include potassium hydroxide or sodium hydroxide, for example. Molybdenum or amorphous silicon may be etched with a dry reactive etching process using a fluorine-based plasma.

In block 604, the first dielectric layer 252 is formed on the sacrificial layer. In some implementations, the first dielectric layer 252 of oxide, low stress nitride, or other appropriate material is formed with a sputtering process, a chemical vapor deposition process, a plasma-enhanced chemical vapor deposition process, or a physical vapor deposition process. In some other implementations, the first dielectric layer of silicon oxide is formed by depositing a silicon layer and subsequently oxidizing the layer. In some implementations, the first dielectric layer 252 is then patterned and etched. The first dielectric layer may be patterned and etched in some implementations using processes used in integrated circuit manufacturing as known by a person having ordinary skill in the art.

In block 606, the first electrode layer 254 is formed on the first dielectric layer 252. In some implementations, the first electrode layer 254 of ruthenium, tungsten, platinum, molybdenum, aluminum, titanium, gold, or other appropriate material is formed with a sputtering process, an electron-beam evaporation process, or an evaporation process. In some implementations, the first electrode layer 254 is then patterned and etched. The first electrode layer 254 may be patterned and etched using processes used in integrated circuit manufacturing as known by a person having ordinary skill in the art.

In block 608, the piezoelectric layer 256 is formed on the first electrode layer 254. In some implementations, the piezoelectric layer 256 can include aluminum nitride, lead zirconate titanate, gallium arsenide, zinc oxide, or other appropriate material is formed with a reactive ion sputtering process or a direct current (DC) sputtering process. When the piezoelectric layer is aluminum nitride, both of these processes are able to produce the aluminum nitride in a layer with a 001 c-axis orientation orthogonal to the plane of the substrate. In some implementations, having this crystallographic orientation is important in forming an aluminum nitride layer with good piezoelectric characteristics, as described above. In some implementations, the piezoelectric layer 256 is then patterned and etched. The piezoelectric layer 256 may be patterned and etched using processes used in integrated circuit manufacturing as known by a person having ordinary skill in the art.

In some implementations, particularly when aluminum nitride is used for the piezoelectric layer 256, it is desirable that the electrode on which the piezoelectric is formed has a low surface roughness. In method 601, with the piezoelectric layer being formed on the first electrode layer, this would mean that the substrate, the sacrificial layer, the first dielectric layer, and the first electrode layer all have low surface roughness. To achieve this, the layers can be formed with processes that generate little surface roughness, since the roughness of the first electrode layer will be affected by the underlying layers.

In block 610, the second electrode layer 258 is formed on the piezoelectric layer 256. The second electrode layer 258 may be formed with a process similar to the process used to form the first electrode layer 254. The second electrode layer may be patterned and etched using processes used in integrated circuit manufacturing as known by a person having ordinary skill in the art.

In block 612, the second dielectric layer 260 is formed on the second electrode layer 258. The second dielectric layer 260 may be formed with a process similar to the process used to form the first dielectric layer. The second dielectric layer may be patterned and etched using processes used in integrated circuit manufacturing as known by a person having ordinary skill in the art.

In block 614, the metal layer 262 is formed on the second dielectric layer 260. Metal layer 262 may be configured as a proof mass, for example, in an electromechanical gyroscope device. The metal layer 262 can include nickel, an alloy of nickel and manganese, an alloy of nickel and cobalt, or other appropriate metal is formed with an electroplating process or a sputtering process. In some implementations, the metal layer 262 and the sacrificial layer have properties such that removing the sacrificial layer, described below, does not also remove the metal layer 262. For example, copper would not be used for the metal layer 262 when copper is also used for the sacrificial layer because the process used to remove the sacrificial layer might also remove all or a portion of the metal layer. In some implementations in which the metal layer 262 is formed with an electroplating process, a seed layer is needed. The seed layer can be formed on the second dielectric layer. In some implementations, the seed layer is formed with a sputtering process, an electron-beam evaporation process, or an evaporation process prior to an electroplating process.

In some implementations, a photoresist layer is used to define the regions on the second dielectric layer 260 on which metal layer 262 will be formed. Photoresists used for electroplating in microelectronics fabrication may be used. For example, the KMPR high aspect ratio photoresist (MicroChem Corporation, Newton, Mass.) may be used for metal electroplating. The KMPR photoresist can be used to form a layer of photoresist with a thickness up to about 100 micrometers with substantially straight sidewalls. It is compatible with various electroplating chemistries. As another example, SU-8 thick photoresist (MicroChem Corporation, Newton, Mass.) may be used for metal electroplating. The SU-8 photoresist may be used to form a layer of photoresist with a thickness up to about 100 micrometers with substantially straight sidewalls. It is also compatible with various electroplating chemistries. As a further example, WBR2050 film type photoresist (DuPont™, Wilmington, Del.) may be used for metal electroplating. The WBR2050 photoresist may be laminated on a wafer or a substrate to form a layer of photoresist with a thickness in the range of about 25 to 50 micrometers with substantially straight sidewalls.

In some implementations, the photoresist may be formed on the surface of the second dielectric layer 260. After forming the photoresist layer on the surface of the second dielectric layer 260, the photoresist may be exposed to an elevated temperature in a pre-exposure bake to remove excess photoresist solvent from the photoresist. Then, portions of the photoresist layer may be exposed to a suitably intense light.

The light affects the photoresist, depending on if the photoresist is a positive photoresist or a negative photoresist. In the case of a positive photoresist, the exposed portions of the photoresist may be dissolved in a developer solution. Conversely, in the case of a negative photoresist, the unexposed portions of the photoresist may be dissolved in a developer solution. When the photoresist is exposed to light, a number of parameters may be controlled, including the light intensity, the exposure time, the depth of focus, and the number of exposure steps. After the photoresist is exposed to the light, the photoresist may be exposed to an elevated temperature in a post-exposure bake. Then, the photoresist can be exposed to the developer to remove the desired portions of the photoresist layer.

The portions of the photoresist layer removed by the developer define the portions on the surface of the second dielectric layer 260 on which metal layer 262 may be formed. The pre-exposure and the post-exposure bake processes, the light parameters, including the light intensity, the exposure time, the depth of focus, and the number of exposure steps, and the type of photoresist can be tailored to obtain a desired sidewall geometry of the metal layer.

In some implementations in which the metal layer is nickel or a nickel alloy, the proof mass is formed by electroplating the nickel or nickel alloy on the second dielectric layer though the photoresist pattern, if present. Wafer or substrate plating tools from Amerimade, Semitool, Nexx Systems, or Novellus, for example, may be used. In these tools, the wafer or substrate may be a cathode immersed inside a plating solution with a nickel metal anode. Plating solutions used for plating a nickel layer can include nickel sulfamate, nickel sulfate, nickel chloride, saccharrin, and boric acid. For purposes of plating a nickel alloy metal layer, the appropriate metal salts are added to the plating solution. For example, to electroplate a nickel cobalt alloy, cobalt sulfate or cobalt chloride is added to the plating solution. As another example, to electroplate a nickel manganese alloy, manganese chloride is added to the plating solution.

After formation of the metal layer 262 in block 614, any photoresist, if present, is removed. The photoresist is removed using processes used in integrated circuit manufacturing as known by a person having ordinary skill in the art. For example, if SU-8 photoresist is present, this photoresist may be removed with a dry reactive ion etching process.

In block 616, the sacrificial layer is removed. If the sacrificial layer is a copper layer, the copper layer may be removed with a wet etching process using a hydrogen peroxide and acetic acid based etchant or using an ammonical sodium persulfate solution. Both these etchants exhibit a good copper removal rate but do not etch nickel or nickel alloys. If the sacrificial layer is an aluminum layer, the aluminum layer may be removed with a wet etching process using an alkaline based etchant. Alkaline based etchants exhibit a good aluminum removal rate but do not etch nickel or nickel alloys. Two examples of alkaline based etchants are potassium hydroxide and sodium hydroxide. If the sacrificial layer is a molybdenum layer or amorphous silicon layer, these layers may be removed with a dry reactive etching process using a fluorine-based plasma.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein. The word "exemplary" is used exclusively herein to mean "serving as an example, instance, or illustration." Any implementation described herein as "exemplary" is not necessarily to be construed as preferred or advantageous over other implementations. Additionally, a person having ordinary skill in the art will readily appreciate, the terms "upper" and "lower" are sometimes used for ease of describing the figures, and indicate relative positions corresponding to the orientation of the figure on a properly oriented page, and may not reflect the proper orientation of the IMOD as implemented.

Certain features that are described in this specification in the context of separate implementations also can be implemented in combination in a single implementation. Conversely, various features that are described in the context of a single implementation also can be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Further, the drawings may schematically depict one more example processes in the form of a flow diagram. However, other operations that are not depicted can be incorporated in the example processes that are schematically illustrated. For example, one or more additional operations can be performed before, after, simultaneously, or between any of the illustrated operations. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products. Additionally, other implementations are within the scope of the following claims. In some cases, the actions recited in the claims can be performed in a different order and still achieve desirable results.

The various illustrative logics, logical blocks, modules, circuits and algorithm steps described in connection with the implementations disclosed herein may be implemented as electronic hardware, computer software, or combinations of both. The interchangeability of hardware and software has been described generally, in terms of functionality, and illustrated in the various illustrative components, blocks, modules, circuits and steps described above. Whether such functionality is implemented in hardware or software depends upon the particular application and design constraints imposed on the overall system.

The hardware and data processing apparatus used to implement the various illustrative logics, logical blocks, modules and circuits described in connection with the aspects disclosed herein may be implemented or performed with a general purpose single- or multi-chip processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, or, any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. In some implementations, particular steps and methods may be performed by circuitry that is specific to a given function.

What is claimed is:

1. An apparatus comprising:
    a metal layer;
    a first dielectric layer disposed on the metal layer;
    a first electrode layer disposed on the first dielectric layer;
    a piezoelectric layer disposed on the first electrode layer, the piezoelectric layer configured to respond to at least one of an electric field or a mechanical force, wherein an entire area of the metal layer is equal to or greater than an entire area of the piezoelectric layer;
    a second electrode layer disposed on the piezoelectric layer, the first electrode layer and the second electrode layer configured to apply the electric field across the piezoelectric layer or to sense an electric field generated by the piezoelectric layer due to the mechanical force; and
    a second dielectric layer disposed on the second electrode layer.

2. The apparatus of claim 1, where the metal layer is configured as a proof mass.

3. The apparatus of claim 1, further comprising:
    a second metal layer disposed on the second dielectric layer.

4. The apparatus of claim 1, wherein a thickness of the metal layer is greater than about 5 micrometers.

5. The apparatus of claim 1, wherein a thickness of the piezoelectric layer is in the range of about 0.5 to 3 micrometers.

6. The apparatus of claim 1, wherein at least one of a thickness of the first electrode layer or a thickness of the second electrode layer are in the range of about 100 to 300 nanometers.

7. The apparatus of claim 1, wherein at least one of a thickness of the first dielectric layer or a thickness of the second dielectric layer are in the range of about 100 to 300 nanometers.

8. The apparatus of claim 1, wherein a thickness of the metal layer is greater than a combined thickness of the first dielectric layer, the first electrode layer, the piezoelectric layer, the second electrode layer, and the second dielectric layer.

9. The apparatus of claim 1, wherein the metal layer includes at least one of nickel, a nickel-manganese alloy, and a nickel-cobalt alloy.

10. The apparatus of claim 1, wherein the piezoelectric layer includes aluminum nitride.

11. The apparatus of claim 1, wherein the first electrode layer and the second electrode layer include a metal selected from the group consisting of copper, platinum, molybdenum, tungsten, ruthenium, gold and aluminum.

12. The apparatus of claim 1, wherein the first dielectric layer and the second dielectric layer include silicon oxide.

13. The apparatus of claim 1, wherein a root mean square roughness of the piezoelectric layer is less than about 1 nanometer.

* * * * *